United States Patent
Ziani (10) Patent No.: US 7,494,617 B2
(45) Date of Patent: Feb. 24, 2009

(54) ENHANCED FORMULATION OF COBALT ALLOY MATRIX COMPOSITIONS

(75) Inventor: Abdelouahab Ziani, Chandler, AZ (US)

(73) Assignee: Heraeus Inc., Chandler, AZ (US)

(*) Notice: Subject to any disclaimer, the term of this patent is extended or adjusted under 35 U.S.C. 154(b) by 313 days.

(21) Appl. No.: 11/237,938

(22) Filed: Sep. 29, 2005

(65) Prior Publication Data

US 2006/0233658 A1     Oct. 19, 2006

Related U.S. Application Data

(60) Provisional application No. 60/672,602, filed on Apr. 18, 2005.

(51) Int. Cl.
C22C 32/00    (2006.01)

(52) U.S. Cl. .......... 419/19; 419/68; 204/298.13; 428/846

(58) Field of Classification Search ............ 204/298.13
See application file for complete search history.

(56) References Cited

U.S. PATENT DOCUMENTS

| | | | |
|---|---|---|---|
| 5,763,923 A | 6/1998 | Hu et al. | |
| 2002/0170821 A1 | 11/2002 | Sandlin et al. | |
| 2003/0017370 A1 | 1/2003 | Kanji et al. | |
| 2003/0228238 A1 | 12/2003 | Zhang et al. | |
| 2004/0018110 A1 | 1/2004 | Zhang | |
| 2004/0188249 A1 | 9/2004 | Sandlin et al. | |
| 2005/0100764 A1 | 5/2005 | Ranjan et al. | |
| 2005/0214588 A1 | 9/2005 | Iwasaki et al. | |

FOREIGN PATENT DOCUMENTS

| | | |
|---|---|---|
| EP | 0 945 858 A | 9/1999 |
| EP | 1 365 389 A | 11/2003 |
| EP | 1 607 940 A | 12/2005 |
| JP | 06 020250 A | 1/1994 |
| JP | 2003-228815 A | 8/2003 |
| WO | WO 02/083974 A1 | 10/2002 |

OTHER PUBLICATIONS

European Search Report, dated Jul. 31, 2006.

Primary Examiner—Roy King
Assistant Examiner—Weiping Zhu
(74) Attorney, Agent, or Firm—McDermott Will & Emery LLP (57) ABSTRACT

A method for manufacturing a single-element matrix cobalt-based granular media alloy composition formulated as $Co_{f_1}$-$(M_uO_v)_{f_2}$, M representing a base metal selected from the group consisting of magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, and $f_1$ and $f_2$ being mole fractions represented by the equation $f_1+(u+v)f_2=1$. The method includes the steps of blending a Co-M master alloy powder and a $Co_uO_v$ powder into a corresponding $(Co_aM_{1-a})_{f_1}$-$(Co_uO_v)_{f_2}$ formula, and densifying the blended powders.

6 Claims, 7 Drawing Sheets

ENHANCED FORMULATION OF COBALT ALLOY MATRIX COMPOSITIONS

CROSS REFERENCE TO RELATED APPLICATIONS

This application claims the benefit of U.S. Provisional Application No. 60/672,602, entitled "Cobalt Alloys Matrix Compositions For Granular Media Thin Films And Formulation Recipes Thereby," filed Apr. 18, 2005.

BACKGROUND OF THE INVENTION

1. Field of the Invention

The present invention generally relates to cobalt alloy fabrication and, in particular, relates to the formulation of cobalt alloy matrix compositions which provide improved sputtering properties and enhanced distribution of major alloy elements, in order to improve the sputtering process and provide increased performance from the resulting thin film.

2. Description of the Related Art

The process of DC magnetron sputtering is widely used in a variety of fields to provide thin film material deposition of a precisely controlled thickness and within narrow atomic fraction tolerances on a substrate, for example to coat semiconductors and/or to form films on surfaces of magnetic recording media. In one common configuration, a racetrack-shaped magnetic field is applied to the sputter target by placing magnets on the backside surface of the target. Electrons are trapped near the sputter target, improving argon ion production and increasing the sputtering rate. Ions within this plasma collide with a surface of the sputter target causing the sputter target to emit atoms from the sputter target surface. The voltage difference between the cathodic sputter target and an anodic substrate that is to be coated causes the emitted atoms to form the desired film on the surface of the substrate.

Figure 1:
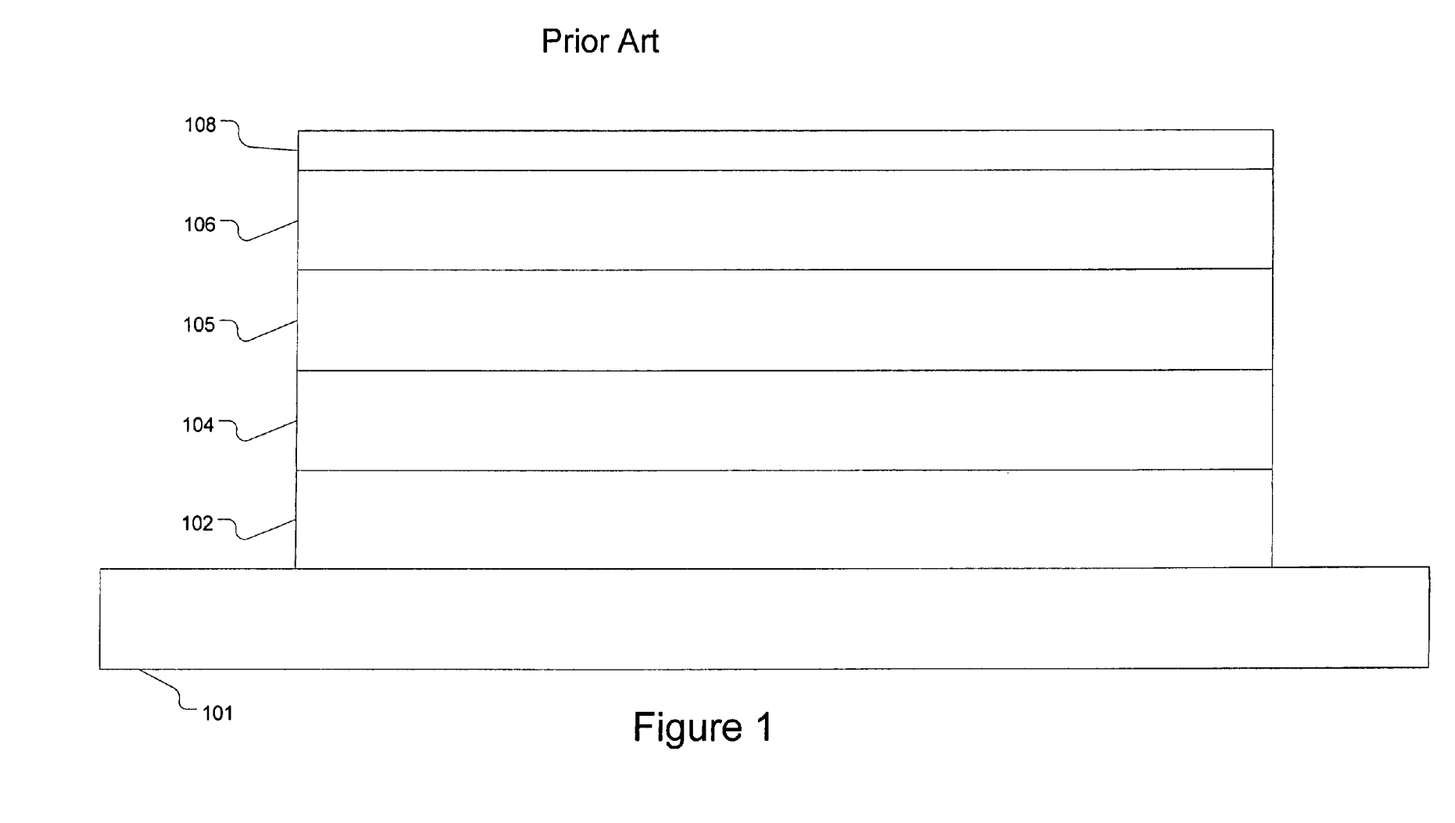
FIG. 1 depicts a conventional thin film 'stack'.

During the production of conventional magnetic recording media, layers of thin films are sequentially sputtered onto a substrate by multiple sputter targets, where each sputter target is comprised of a different material, resulting in the deposition of a thin film "stack." FIG. 1 illustrates one such typical thin film stack for conventional magnetic recording media. At the base of the stack is non-magnetic substrate 101, which is typically aluminum or glass. Seed layer 102, the first deposited layer, forces the shape and orientation of the grain structure of higher layers, and is commonly comprised of NiP or NiAl. Next, soft magnetic underlayer ("SUL") 104, which is often comprised of alloys such as FeCoB, CoNbZr, CoTaZr or CoTaNb, is formed provide a return path for the read/write magnetic field. SUL 104 is amorphous, preventing magnetic domain formation which could potentially cause signal-to-noise ("SNR") degradation.

Seed layer 105 is formed above SUL 104 in order to promote oriented growth of higher layers. Seed layer 105 is often comprised of ruthenium (Ru), since ruthenium (Ru) provides a hexagonal-close-packed ("HCP") lattice parameter which is similar to cobalt (Co) HCP. For high-density data recording applications, magnetic data-storing layer 106 is deposited over seed layer 105, where data-storing layer 106 is a metal matrix composite composed of a ferromagnetic alloy matrix and a metal oxide. Typically, the ferromagnetic alloy matrix is typically a binary matrix alloy, such as CoPt, a ternary matrix alloy, such as CoCrPt, or a quaternary matrix alloy, such as CoCrPtX, where X is a boron (B), tantalum (Ta), niobium (Nb), zirconium (Zr), copper (Cu), silver (Ag) or gold (Au) alloy. Although many different oxides can be used, the most common metal oxide is either $SiO_2$ or $TiO_2$, due to the high affinity of base metals silicon (Si) and titanium (Ti) for oxygen, and observed beneficial data storage performance resulting from these oxides. Finally, carbon lubricant layer 108 is formed over magnetic data-storing layer 106.

The amount of data that can be stored per unit area on a magnetic recording medium is inversely proportional to the grain size of magnetic data-storing layer 106 and, correspondingly, to the sputter target material composition from which the data-storing layer is sputtered, where a 'grain' corresponds to a single, approximately ten nanometer crystal of the thin film alloy. Grain boundary segregation, a measure of the physical separation of the grains, also contributes to increased data storage capacity, where grain size and grain boundary segregation are directly influenced by the characteristics of the sputtering target microstructure from which the data-storing layer was sputtered, and the degree of structural refinement of the seed layer.

To sustain the continuous growth in data storage capacity demanded by magnetic data storage industry, a technique known as "perpendicular magnetic recording" ("PMR"), as opposed to conventional "longitudinal magnetic recording" ("LMR"), has been the most promising and efficient technology, due to its higher write efficiency using a perpendicular single-pole recording head, in combination with a soft underlayer. Using PMR, bits are recorded perpendicular to the plane of the magnetic recording medium, allowing for a smaller bit size and greater coercivity. In the future, PMR is expected to increase disk coercivity and strengthen disk signal amplitude, translating into superior archival data retention.

Oxygen (O)-containing composite PMR media can provide beneficial grain boundaries segregation by developing oxygen-rich grain boundary regions. Early granular media development work recognized the significant effect of oxygen (O) in suppressing the degradation of the anisotropy constant ("$K_u$") resulting from thermal instability whenever the device underwent local overheating during operation. Oxygen (O)-containing media also exhibit low media noise and high thermal stability and are useful in high density PMR. Therefore, oxygen (O)-containing grain boundary regions in magnetic alloys acts as a grain refiner and a grain growth inhibitor, providing effective physical separation of grains. This physical separation, in turn, decreases grain-to-grain magnetic coupling, and increases SNR and thermal stability of the magnetization.

With conventional magnetic recording media, the magnetic data-storing layer 106 is deposited on top of a ruthenium (Ru)-based seed layer 105, where the purpose of seed layer 105 is to produce textured growth in the media layer. A high recording density, up to 200 Gbits/in$^2$, is commonly achieved via the nucleation of nano-scale grains and effective grain isolation, allowing for a strong resistance to thermal agitation of the magnetization within the grains. Typically, in this mode of grain structure, a composite alloy such as $(Co_{90}Cr_{10})_{80}$ $Pt_{20}$-$10SiO_2$ (mol. %) displays a grain magnetocrystalline anisotropy $K_u$ value on the order of $7 \times 10^6$ erg. cm$^{-3}$, which indicates a high thermal stability for this media.

Accordingly, it is desirable to provide cobalt (Co)-based alloy matrix compositions with a lower weight fraction of the ferromagnetic phase, and an appropriate volume fraction of the oxide constituent, in order to achieve the enhanced sputtering performances for the granular media sputtering material. In particular, it is desirable to provide a method for manufacturing oxide containing compositions which have a reduced amount of the total ferromagnetic phase, in order to minimize the amount of ferromagnetic phase in a sputtering target. In this regard, the present invention accomplishes these and other objectives by substituting the oxide or oxides of the most reactive element that would form upon sputtering by an oxide of the base matrix alloy as a source for oxygen, and introducing any reactive elements directly into the matrix in order to achieve a further degree of dilution of the matrix base metal.

BRIEF SUMMARY OF THE INVENTION

The present invention generally relates to cobalt alloy fabrication and, in particular, relates to the formulation of cobalt alloy matrix compositions which provide improved sputtering properties and enhanced distribution of major alloy elements, in order to improve the sputtering process and provide increased performance from the resulting thin film. In this regard, the present invention discloses a preparation method, including a formulation strategy and materials or compositions produced thereby, which provides for a useful alternative for the production of sputtering targets with improved sputtering properties, and a beneficial distribution of major alloy elements.

Granular media alloys are composite materials combining a cobalt (Co) or cobalt-alloy matrix, and one or more oxide particles, including oxide particles selected from the group of: magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and/or tungsten (W) oxides. Accordingly the alternative formulation approaches, and resultant powdered raw materials disclosed herein may be used to manufacture a broad range of cobalt-based granular media alloys.

According to a first arrangement, the present invention is a method for manufacturing a single-element matrix cobalt-based granular media alloy composition formulated as $Co_{f_1}$-$(M_uO_v)_{f_2}$, M representing a base metal selected from the group consisting of magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, and $f_1$ and $f_2$ being mole fractions represented by the equation $f_1+(u+v)f_2=1$. The method includes the steps of blending a Co-M master alloy powder and a $Co_uO_{v'}$ powder into a corresponding $(Co_aM_{1-a})_{f_1'}$-$(Co_{u'}O_{v'})_{f_2'}$ formula, and densifying the blended powders. According to this arrangement, $f_2'$ is represented by Equation (1), $f_1'$ is represented by Equation (2), and a is represented Equation (3), all below:

$$f_2' = \frac{v}{v'} \cdot f_2 \quad (1)$$

$$f_1' = 1 - \frac{v}{v'}(u' + v')f_2 \quad (2)$$

$$a = \frac{1-(u+v)f_2 - u' \cdot \frac{v}{v'} \cdot f_2}{1 - \frac{v}{v'}(u'+v')f_2} = \frac{1 - \frac{v}{v'}(u'+v')f_2 - u \cdot f_2}{1 - \frac{v}{v'}(u'+v')f_2} \quad (3)$$

According to this first arrangement, it is understood that any $Co_uO_{v'}$ oxide based binary matrix composite is regarded as chemically equivalent to a $M_uO_v$ oxide based single element matrix composite if $$\frac{f_1'(1-a)}{f_2' \cdot v'} = \frac{u}{v}.$$

The method further includes the step of ball milling the blended powder. The method also includes the steps of encapsulating the blended powders in a can, evacuating gasses from the can, and subjecting the can to high temperature and pressure.

According to a second arrangement, the present invention is a method for manufacturing a binary matrix cobalt-based granular media alloy composition formulated as $(Co_aPt_{1-a})_{f_2}$-$(M_uO_v)_{f_2}$, M representing a base metal selected from the group consisting of magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a representing an atom fraction, $f_1$ and $f_2$ representing mole fractions expressed by the equation $f_1+(u+v)f_2=1$. The method includes the steps of blending a $Co_{a'}M_{b'}Pt_{1-a'-b'}$ master alloy powder and a $Co_{u'}O_{v'}$ powder into a corresponding $(Co_aM_bPt_{a'-b'})_{f_1'}$-$(Co_{u'}O_{v'})_{f_2'}$ formula, and densifying the blended powders. According to this arrangement, $f_2'$ is represented by Equation (1), and $f_1'$ is represented by Equation (2) (both above), and a' and b' are represented by Equations (4) and (5), respectively, below:

$$a' = \frac{f_1 \cdot a - u' \cdot \frac{v}{v'} \cdot f_2}{1 - \frac{v}{v'}(u'+v')f_2} \quad (4)$$

$$b' = \frac{f_2 \cdot u}{1 - \frac{v}{v'}(u'+v')f_2} \quad (5)$$

According to this second arrangement, it is understood that any $Co_uO_{v'}$ oxide based ternary matrix composite is regarded as chemically equivalent to a $M_uO_v$ oxide based binary matrix composite if $$\frac{f_1' \cdot b'}{f_2' \cdot v'} = \frac{u}{v}.$$

According to a third arrangement, the present invention is a method for manufacturing a ternary matrix cobalt-based granular media alloy composition formulated as $(Co_aCr_bPt_{1-a-b})_{f_1}$-$(M_uO_v)_{f_2}$, M representing a base metal selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal. M and oxygen (O) per oxide formula, respectively, a and b representing atom fractions, $f_1$ and $f_2$ representing mole fractions expressed by the equation $f_1+(u+v)f_2=1$. The method includes the steps of blending a $Co_aCr_bPt_cM_{d'}$ master alloy powder and a $Co_uO_{v'}$ powder into a corresponding $(Co_aCr_bPt_cM_{d'})_{f_1'}$-$(Co_uO_{v'})_{f_2'}$ formula, and densifying the blended powders. According to this arrangement, $f_2'$ is represented by Equation (1), $f_1'$ is represented by Equation (2), and a' is represented by Equation (4), supra, and b', c' and d' are represented by Equations (6) to (8), respectively, below:

$$b' = \frac{f_1 \cdot b}{1 - \frac{v}{v'}(u' + v')f_2} \quad (6)$$

$$c' = \frac{f_1 \cdot c}{1 - \frac{v}{v'}(u' + v')f_2} \quad (7)$$

$$d' = \frac{f_2 \cdot u}{1 - \frac{v}{v'}(u' + v')f_2} \quad (8)$$

According to this third arrangement, it is understood that any $Co_{u'}O_{v'}$ oxide based quaternary matrix composite is regarded as chemically equivalent to a $M_uO_v$ oxide based ternary matrix composite if $$\frac{f_1' \cdot d'}{f_2' \cdot v'} = \frac{u}{v}.$$

According to a fourth arrangement, the present invention is a method for manufacturing a ternary matrix cobalt-based granular media alloy composition formulated as $(Co_aCr_bPt_{1-a-b})_{f_1}$-$(M_uO_v)_{f_2}$, M representing a base metal selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium, (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$. The method includes the steps of blending a $Co_{a''}Cr_{b''}Pt_{c''}M_{d''}$ master alloy powder and a $Cr_{u''}O_{v''}$ powder into a corresponding $(Co_{a''}Cr_{b''}Pt_{c''}M_{d''})_{f_1''}$-$(Cr_{u''}O_{v''})_{f_2''}$ formula, and densifying the blended powders. According to this arrangement, the conditions expressed in Equation (9), below, apply:

$$f_1 \cdot b - \frac{v}{v''} \cdot u'' \cdot f_2 \geq 0 \quad (9)$$

Furthermore, according to the fourth arrangement of the present invention, $f_2''$ is represented by Equation (10), $f_1''$ is represented by Equation (11), and a'', b'', c'' and d'' are represented by Equations (12) to (15), respectively, below:

$$f_2'' = \frac{v}{v''} \cdot f_2 \quad (10)$$

$$f_1'' = 1 - \frac{v}{v''}(u'' + v'')f_2 \quad (11)$$

$$a'' = \frac{f_1 \cdot a}{1 - \frac{v}{v''}(u'' + v'')f_2} \quad (12)$$

$$b'' = \frac{f_1 \cdot b - \frac{v}{v''} \cdot u'' \cdot f_2}{1 - \frac{v}{v''}(u'' + v'')f_2} \quad (13)$$

$$c'' = \frac{f_1 \cdot c}{1 - \frac{v}{v''}(u'' + v'')f_2} \quad (14)$$

$$d'' = \frac{f_2 \cdot u}{1 - \frac{v}{v''}(u'' + v'')f_2} \quad (15)$$

According to this fourth arrangement, it is understood that any $Cr_{u''}O_{v''}$ oxide based quaternary matrix composite is regarded as chemically equivalent to a $M_uO_v$ oxide based ternary matrix composite if $$\frac{f_1'' \cdot d''}{f_2'' \cdot v''} = \frac{u}{v}.$$

According to a fifth arrangement, the present invention is a method for manufacturing a quaternary matrix cobalt-based granular media alloy composition formulated as $(Co_aCr_bPt_cM'_d)_{f_1}$-$(M_uO_v)_{f_2}$, M' representing an element selected from the group consisting of boron (B), tantalum (Ta), niobium (Nb), zirconium (Zr), copper (Cu), silver (Ag), gold (Au), and ruthenium (Ru), M representing a base metal different from M' and selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$, and d being represented by the equation $d=1-a-b-c$. The method includes the steps of blending a $Co_{a'}Cr_{b'}Pt_{c'}M'_{d'}M_{e'}$ master alloy powder and a $Co_{u'}O_{v'}$ powder into a corresponding $(Co_{a'}Cr_{b'}Pt_{c'}M'_{d'}M_{e'})_{f_1'}$-$(Co_{u'}O_{v'})_{f_2'}$ formula, and densifying the blended powders. According to this arrangement, $f_2'$ is represented by Equation (1), $f_1'$ is represented by Equation (2), and a', b' and c' are represented by Equations (4), (6) and (7), respectively, supra, and d', and e' are represented by Equations (16) and (17), respectively, below:

$$d' = \frac{f_1 \cdot d}{1 - \frac{v}{v'}(u' + v')f_2} \quad (16)$$

$$e' = \frac{f_2 \cdot u}{1 - \frac{v}{v'}(u' + v')f_2} \quad (17)$$

According to this fifth arrangement, it is understood that any $Co_{u'}O_{v'}$ oxide based 5 elements matrix composite is regarded as chemically equivalent to a $M_uO_v$ oxide based quaternary matrix composite if $$\frac{f_1' \cdot e'}{f_2' \cdot v'} = \frac{u}{v}.$$

According to a sixth arrangement, the present invention is a method for manufacturing a quaternary matrix cobalt-based granular media alloy composition formulated as $(Co_aCr_bPt_cM'_d)_{f_1}\text{-}(M_uO_v)_{f_2}$, M' representing an element selected from the group consisting of boron (B), tantalum (Ta), niobium (Nb), zirconium (Zr), copper (Cu), silver (Ag), gold (Au), and ruthenium (Ru), M representing a base metal different from M' and selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$, and d being represented by the equation $d=1-a-b-c$. The method includes the steps of blending a $Co_{a''}Cr_{b''}Pt_{c''}M'_{d''}M_{e''}$ master alloy powder and a $Cr_{u''}O_{v''}$ powder into a corresponding $(Co_{a''}Cr_{b''}Pt_{c''}M'_{d''}M_{e''})_{f_1'}\text{-}(Cr_{u''}O_{v''})_{f_2'41}$ formula. According to this arrangement, the conditions expressed in Equation (9), supra, apply.

Furthermore, according to the sixth arrangement of the present invention, $f_2''$ is represented by Equation (10), $f_1''$ is represented by Equation (11), and a", b", and c" are represented by Equations (12) to (14), respectively, supra. Additionally, d" and e" are represented by Equations (18) and (19), below:

$$d'' = \frac{f_1 \cdot d}{1 - \frac{v}{v''}(u''+v'')f_2} \quad (18)$$

$$e'' = \frac{f_2 \cdot u}{1 - \frac{v}{v''}(u''+v'')f_2} \quad (19)$$

In to this sixth arrangement, it is understood that any $Cr_{u''}O_{v''}$ oxide based quaternary matrix composite is regarded as chemically equivalent to a $M_uO_v$ oxide based ternary matrix composite if $$\frac{f_1'' \cdot e''}{f_2'' \cdot v''} = \frac{u}{v}.$$

Moreover, seventh through twelfth arrangements of the present invention are also further contemplated, where each of the seventh through twelfth arrangements are single-element matrix, binary matrix, ternary matrix or quaternary matrix cobalt-based granular media alloy compositions which are produced using the process disclosed in the first through sixth arrangements, above.

In the following description of the preferred embodiment, reference is made to the accompanying drawings that form a part thereof, and in which is shown by way of illustration a specific embodiment in which the invention may be practiced. It is to be understood that other embodiments may be utilized and changes may be made without departing from the scope of the present invention.

BRIEF DESCRIPTION OF THE DRAWINGS

Referring now to the drawings, in which like reference numbers represent corresponding parts throughout.

DETAILED DESCRIPTION OF THE INVENTION

The present invention discloses a preparation method, including a formulation strategy and materials or compositions produced thereby, which provides for a useful alternative for the manufacture of sputtering targets with improved sputtering properties and preferential distribution of major alloy elements.

Granular media alloys are composite materials combining a cobalt (Co) or cobalt-alloy matrix and one or more oxide particles, where the oxide particles are selected from magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and/or tungsten (W) oxides. Accordingly the alternative formulation approach and resultant powdered raw materials disclosed herein may be used to manufacture a broad range of cobalt-based granular media alloys. Specific alloy families contemplated by the present invention are described below:

SINGLE ELEMENT MATRIX: $Co\text{-}M_uO_v$, where the base metal M for the oxide is magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), or tungsten (W).

BINARY MATRIX: $Co\text{—}Pt\text{-}M_uO_v$, where the base metal M for the oxide is magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), or tungsten (W).

TERNARY MATRIX: $Co\text{—}Cr\text{—}Pt\text{-}M_uO_v$, where the base metal M for the oxide is magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), or tungsten (W).

QUATERNARY MATRIX: Co—Cr—Pt-M'-$M_uO_v$, where M' is boron (B), tantalum (Ta), niobium (Nb), zirconium (Zr), copper (Cu), silver (Ag), gold (Au), or ruthenium (Ru), the base metal M is magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and/or tungsten (W), and where M'≠M.

Although the present invention is described, both supra and infra, using examples of one to four element matrices, alternate arrangements of the present invention are not limited to these explicitly described examples. In particular, the principles described herein also apply to cobalt (Co) alloy matrix composites with more than four elements as well.

Some of the most desirable cobalt (Co) alloy compositions include Co—Pt—$SiO_2$ (or —$TiO_2$), Co—Cr—Pt—$SiO_2$ (or —$TiO_2$) and, in some instances, a combination of the two oxides or other oxides within pre-determined mole fractions. Although pure elemental powders have been utilized as one fabrication technique for these granular media alloys, for practical and cost considerations cobalt (Co) has always been tied up in a Co—Cr or a Co—Cr—B pre-alloyed powder for chemical uniformity and PTF control. The oxide constituent is admixed as a pure powder, due to the lack of an alternative for making pre-alloyed, oxide-based powdered composite. Platinum (Pt) is also back-blended as a pure powder, in order to provide better control of input material, due to the high cost of the material.

For a given granular media material, many possible alloy formulations are possible. In a simple example instance of a Co-$M_uO_v$ granular alloy, two different blend formulations may be used. In one case, two powder constituents, i) the cobalt (Co) powder and ii) the $M_uO_v$ oxide powder, are mixed to achieve a target composition of $Co_{f_1}$-$(M_uO_v)f_2$, where $f_1$ and $f_2$ (and $f_1'$ and $f_2'$) are mole fractions represented by the equation $f_1+(u+v)f_2=1$. In an other case, the same composition is produced by mixing a powder of a Co-M master alloy based matrix and $Co_uO_{v'}$ oxide powder into a corresponding $(Co_aM_{1-a})_{f_1'}$-$(Co_uO_{v'})_{f_2'}$ formula, where $f_1'$ and $f_2'$ are expressed in Equations (1) and (2). For any $Co_uO_{v'}$ oxide raw material chosen as the source for the oxygen (O), the composition of the Co-M master alloy based matrix, and the relative mole fractions can be computed, as described in more detail below.

Figure 2:
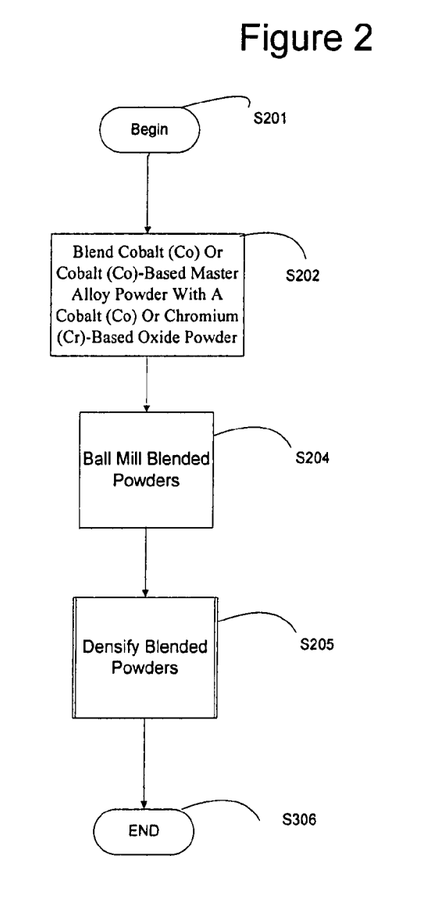
FIGS. 2 and 2A depicts method for manufacturing a single-element matrix, binary matrix, ternary matrix, or quaternary matrix cobalt (Co)-based granular media alloy composition, according to one embodiment of the present invention.
Figure 2A:
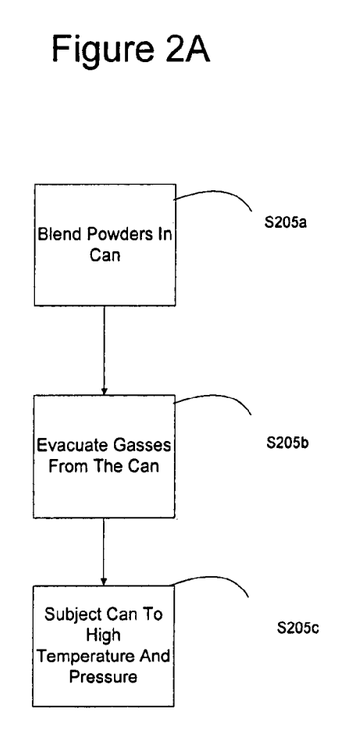

FIGS. 2 and 2A depicts method for manufacturing a single-element matrix, binary matrix, ternary matrix, or quaternary matrix cobalt (Co)-based granular media alloy composition, according to a first embodiment of the present invention. Briefly, the method relates to the manufacture of a cobalt-based granular media alloy composition, and includes the steps of blending a cobalt (Co)-based master alloy powder with a cobalt (Co) or chromium (Cr)-based oxide into a specified formula, and densifying the blended powders.

In more detail, the process begins (step S201), and a cobalt (Co) or cobalt (Co)-based master alloy powder is blended with a cobalt (Co) or chromium (Cr)-based oxide powder (step S202).

One particular arrangement relates to the manufacture of a single-element matrix cobalt-based granular media alloy composition formulated as $Co_{f_1}$-$(M_uO_v)_{f_2}$, M representing a base metal selected from the group consisting of magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, and $f_1$ and $f_2$ being mole fractions represented by the equation $f_1+(u+v)f_2=1$. In this particular arrangement, a Co-M master alloy powder and a $Co_uO_{v'}$ powder are blended into a corresponding $(Co_aM_{1-a})_{f_1'}$-$(Co_uO_{v'})_{f_2'}$ formula in step S202, where $f_2'$ is represented by Equation (1), $f_1'$ is represented by Equation (2), and a is represented Equation (3), all below:

$$f_2' = \frac{u}{v'} \cdot f_2 \quad (1)$$

$$f_1' = 1 - \frac{v}{v'}(u' + v')f_2 \quad (2)$$

$$a = \frac{1-(u+v)f_2 - u' \cdot \frac{v}{v'} \cdot f_2}{1 - \frac{v}{v'}(u'+v')f_2} = \frac{1 - \frac{v}{v'}(u'+v')f_2 - u \cdot f_2}{1 - \frac{v}{v'}(u'+v')f_2} \quad (3)$$

It should be noted that, for all of the formulas noted herein, that a base atom fraction of 1 has been imposed for each alloy formula to accommodate the derivation of the atom and mole fractions for the enhanced alloy formulation. For example, an alloy formula such as $(Cu_{0.71}Cr_{0.13}Pt_{0.16})_{0.92}$—$(Nb_2O_5)_{0.08}$ which sums to a total mole fraction of 1.48 could be reduced for commodity to the equivalent to the $(Co_{0.71}Cr_{0.13}Pt_{0.16})_{0.622}$—$(Nb_2O_5)_{0.0541}$ formula, which yields a total mole fraction of 1.

Furthermore, this first arrangement, it is understood that any $Co_uO_{v'}$ oxide based binary matrix composite is regarded as chemically equivalent to a $M_uO_v$ oxide based single element matrix composite if $$\frac{f_1'(1-a)}{f_2' \cdot v'} = \frac{u}{v}.$$

An additional arrangement relates to the manufacture of binary matrix cobalt-based granular media alloy composition formulated as $(Co_aPt_{1-a})_{f_1}$-$(M_uO_v)_{f_2}$, M representing a base metal selected from the group consisting of magnesium (Mg), titanium (Ti), vanadium (V), chromium (Cr), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a representing an atom fraction, $f_1$ and $f_2$ representing mole fractions expressed by the equations $f_1+(u+v)f_2=1$. According to this particular arrangement, a $Co_aM_bPt_{1-a'-b'}$ master alloy powder and a $Co_uO_{v'}$ powder are blended into a corresponding $(Co_aM_bPt_{1-a'-b'})_{f_1'}$—$(Co_uO_{v'})_{f_2'}$ formula in step S202, where $f_2'$ is represented by Equation (1), and $f_1'$ is represented by Equation (2) (both above), and where a' and b' are represented by Equations (4) and (5), respectively, below:

$$a' = \frac{f_1 \cdot a - u' \cdot \frac{v}{v'} \cdot f_2}{1 - \frac{v}{v'}(u' + v')f_2} \quad (4)$$

$$b' = \frac{f_2 \cdot u}{1 - \frac{v}{v'}(u' + v')f_2} \quad (5)$$

According to this arrangement, it is understood that any $Co_{u'}O_{v'}$ oxide based ternary matrix composite is regarded as chemically equivalent to a $M_uO_v$ oxide based binary matrix composite if $$\frac{f_1' \cdot b'}{f_2' \cdot v'} = \frac{u}{v}.$$

A further arrangement relates to a method for manufacturing a ternary matrix cobalt-based granular media alloy composition formulated as $(Co_aCr_bPt_{1-a-b})_{f_1}-(M_uO_v)_{f_2}$, M representing a base metal selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$. According to this particular arrangement, a $Co_aCr_bPt_cM_{d'}$ master alloy powder and a $Co_{u'}O_{v'}$ powder are blended into a corresponding $(Co_aCr_bPt_cM_{d'})_{f_1'}-(Co_{u'}O_{v'})_{f_2'}$ formula in step S202, where $f_2'$ is represented by Equation (1), $f_1'$ is represented by Equation (2), and a' is represented by Equation (4), supra, and where b', c' and d' are represented by Equations (6) to (8), respectively, below:

$$b' = \frac{f_1 \cdot b}{1 - \frac{v}{v'}(u' + v')f_2} \quad (6)$$

$$c' = \frac{f_1 \cdot c}{1 - \frac{v}{v'}(u' + v')f_2} \quad (7)$$

$$d' = \frac{f_2 \cdot u}{1 - \frac{v}{v'}(u' + v')f_2} \quad (8)$$

According to this arrangement, it is understood that any $Co_{u'}O_{v'}$ oxide based quaternary matrix composite is regarded as chemically equivalent to a $M_uO_v$ oxide based ternary matrix composite if $$\frac{f_1' \cdot d'}{f_2' \cdot v'} = \frac{u}{v}.$$

Furthermore, another arrangement of the present invention relates to a method for manufacturing a ternary matrix cobalt-based granular media alloy composition formulated as $(Co_aCr_bPt_{1-a-b})_{f_1}-(M_uO_v)_{f_2}$, M representing a base metal selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$. According to this particular arrangement, a $Co_{a''}Cr_{b''}Pt_{c''}M_{d''}$ master alloy powder and a $Cr_{u''}O_{v''}$ powder are blended into a corresponding $(Co_{a''}Cr_{b''}Pt_{c''}M_{d''})_{f_1''}-(Cr_{u''}O_{v''})_{f_2''}$ formula in step S202, where the conditions expressed in Equation (9), below, apply:

$$f_1 \cdot b - \frac{v}{v''} \cdot u'' \cdot f_2 \geq 0 \quad (9)$$

According to this particular arrangement, $f_2''$ is represented by Equation (10), $f_1''$ is represented by Equation (11), and a'', b'', c'' and d'' are represented by Equations (12) to (15), respectively, below:

$$f_2'' = \frac{v}{v''} \cdot f_2 \quad (10)$$

$$f_1'' = 1 - \frac{v}{v''}(u'' + v'')f_2 \quad (11)$$

$$a'' = \frac{f_1 \cdot a}{1 - \frac{v}{v''}(u'' + v'')f_2} \quad (12)$$

$$b'' = \frac{f_1 \cdot b - \frac{v}{v''} \cdot u'' \cdot f_2}{1 - \frac{v}{v''}(u'' + v'')f_2} \quad (13)$$

$$c'' = \frac{f_1 \cdot c}{1 - \frac{v}{v''}(u'' + v'')f_2} \quad (14)$$

$$d'' = \frac{f_2 \cdot u}{1 - \frac{v}{v''}(u'' + v'')f_2} \quad (15)$$

According to this arrangement, it is understood that any $Cr_{u''}O_{v''}$ oxide based quaternary matrix composite is regarded as chemically equivalent to a $M_uO_v$ oxide based ternary matrix composite if $$\frac{f_1'' \cdot d''}{f_2'' \cdot v''} = \frac{u}{v}.$$

Another arrangement relates to a method for manufacturing a quaternary matrix cobalt-based granular media alloy composition formulated as $(Co_aCr_bPt_cM'_d)_{f_1}-(M_uO_v)_{f_2}$, M' representing an element selected from the group consisting of boron (B), tantalum (Ta), niobium (Nb), zirconium (Zr), copper (Cu), silver (Ag), gold (Au), and ruthenium (Ru), M representing a base metal different from M' and selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$, and d being represented by the equation $d=1-a-b-c$. According to this particular arrangement, a $Co_aCr_bPt_cM'_dM_e$, master alloy powder and a $Co_uO_v$, powder are blended into a corresponding $(Co_aCr_bPt_cM'_dM_e)_{f_1'}$-$(Co_uO_v)_{f_2'}$, formula in step S202. In this arrangement, $f_2'$ is represented by Equation (1), $f_1'$ is represented by Equation (2), and a', b' and c' are represented by Equations (4), (6) and (7), respectively, supra, and d', and e' are represented by Equations (16) and (17), respectively, below:

$$d' = \frac{f_1 \cdot d}{1 - \frac{v}{v'}(u' + v')f_2} \quad (16)$$

$$e' = \frac{f_2 \cdot u}{1 - \frac{v}{v'}(u' + v')f_2} \quad (17)$$

According to this arrangement, it is understood that any $Co_uO_v$, oxide based 5 elements matrix composite is regarded as chemically equivalent to a $M_uO_v$ oxide based quaternary matrix composite if $$\frac{f_1' \cdot e'}{f_2' \cdot v'} = \frac{u}{v}.$$

Moreover, another arrangement of the present invention relates to a method for manufacturing a quaternary matrix cobalt-based granular media alloy composition formulated as $(Co_aCr_bPt_cM'_d)_{f_1}$-$(M_uO_v)_{f_2}$, M' representing an element selected from the group consisting of boron (B), tantalum (Ta), niobium (Nb), zirconium (Zr), copper (Cu), silver (Ag), gold (Au), and ruthenium (Ru), M representing a base metal different from M' and selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$, and d being represented by the equation $d=1-a-b-c$. According to this particular arrangement, a $Co_{a''}Cr_{b''}Pt_{c''M'd''}M_{e''}$ master alloy powder and a $Cr_{u''}O_{v''}$ powder are blended into a corresponding $(Co_{a''}Cr_{b''}Pt_{c''M'd''}M_{e''})_{f_1''}$-$(Cr_{u''}O_{v''})_{f_2''}$ formula in step S202. According to this arrangement, the conditions expressed in Equation (9), supra, apply.

According to this arrangement, $f_2''$ is represented by Equation (10), $f_1''$ is represented by Equation (11), and a", b", and c" are represented by Equations (12) to (14), respectively, supra. Additionally, d" and e" are represented by Equations (18) and (19), below:

$$d'' = \frac{f_1 \cdot d}{1 - \frac{v}{v''}(u'' + v'')f_2} \quad (18)$$

$$e'' = \frac{f_2 \cdot u}{1 - \frac{v}{v''}(u'' + v'')f_2} \quad (19)$$

In to this sixth arrangement, it is understood that any $Cr_{u''}O_{v''}$ oxide based quaternary matrix composite is regarded as chemically equivalent to a $M_uO_v$ oxide based ternary matrix composite if $$\frac{f_1'' \cdot e''}{f_2'' \cdot v''} = \frac{u}{v}.$$

The blended powders are ball milled (step S204). According to an alternate aspect, the blended powders are milled using a different technique, or are not milled at all. Ball milling techniques are well known to those skilled in the powder metallurgy art.

The blended powders are densified (step S205), and the process ends (step S206). As seen in more detail in FIG. 2A, the densifying step (step S205) further includes the steps of encapsulating the blended powders in a can (step S205a), evacuating gasses from the can (step S205b), and subjecting the can to high temperature and pressure (step S205c). The powder densification processes described in steps S205a to S205c are well known to those skilled in the powder metallurgy art.

Turning now to a practical example of the above-described enhanced manufacturing methods, a granular media alloy such as $Co_{90}$—$(SiO_2)_{10}$ can be formulated as a $(Co_{0.875}Si_{0.125})_{80}(CoO)_{20}$ composite. This formulation allows for the introduction of cobalt (Co) through CoO and a Co—Si master alloy in order to achieve the desired PTF for sputtering. Similarly, a $(Co_aCr_bPt_{1-a-b})_{f_1}$-$(M_uO_v)_{f_2}$ (M≠Co, Cr) granular alloy can also be converted into a cobalt (Co)-oxide containing composite $(Co_aCr_bM_cPt_{d'})_{f_1'}$—$(Co_uO_v)_{f_2'}$ or into a chromium (Cr)-oxide containing composite $(Co_{a''}Cr_{b''}M_{c''}Pt_{d''})_{f_1''}$—$(Cr_{u''}O_{v''})_{f_2''}$. Both formulations are useful for tailoring the sputtering to desired characteristics, and achieve the dual objective of improving the target PTF and reducing particle generation.

Although, in terms of target formulation, the nominal composition of the granular media alloy can be achieved utilizing various approaches and using the available raw materials, the present invention provides adequate recipes for the enhanced distribution and constitution of the resulting phases of the target microstructure, by the appropriate selection of the raw materials. In particular, a cobalt (Co) alloy based matrix-oxide composite sputtering material intended for the deposition of a granular media with a $SiO_2$ or $TiO_2$ grain boundaries segregation is formulated such as the final weight fraction of the ferromagnetic cobalt alloy matrix is reduced.

Also affected is target PTF, which is a measure of the amount of magnetic flux lines that passes through the ferromagnetic material of a target of a given thickness, and which is inversely proportional to the permeability of the material. The permeability of a multi-component material is also directly proportional to the weight fraction of the ferromagnetic component. Accordingly, by minimizing the weight fraction of the ferromagnetic phase, the PTF of the target and the sputtering yield is also enhanced.

Furthermore, for a given granular media nominal composition and oxygen (O) content, the oxide is selected such that its resulting volume fraction is large enough to ensure an beneficial distribution of the oxide particles throughout the target volume. Concurrently, selecting oxides of other alloy elements than silicon (Si) or titanium (Ti) offers the possibility of introducing the later element directly into the ferromagnetic matrix, which is another mean of increasing the PTF through an additional dilution of the base cobalt (Co) matrix.

In contrast, the atoms and molecules of the target material are dissociated during sputtering and a plasma of free atoms is formed which later re-combine and deposit on the disc to yield a film of uniform grains of the base ferromagnetic material. The solid-state solubility of oxygen (O) in the ferromagnetic material being very limited, consequently, most of the oxygen (O) is driven towards the grain boundaries were the oxygen (O) forms an oxide or oxides of the most reactive elements of the media alloy, which in many cases are essentially $SiO_2$ or $TiO_2$.

In the case of a $(Co_{71}Cr_{13}Pt_{16})_{90}$—$(SiO_2)_{10}$ granular alloy, this solution is exemplified through two alternative formulations of the alloy which yield substantially the same nominal composition. The first formulation suggests the preparation of a multi-component powder blend of the individual elements cobalt (Co), chromium (Cr), platinum (Pt) and/or master alloys of these elements to which a $SiO_2$ powder could be admixed. In another aspect, a cobalt oxide such as CoO could be selected as the raw material source for oxygen while silicon could be added directly or through a master alloy as the fourth element of the equivalent $(Co_{54.88}Cr_{14.62}Si_{12.50}Pt_{18.00})_{80}$—$(CoO)_{20}$ alloy formula.

The volume fraction of oxide which is a measure of the oxide phase dispersion can be increased if the density of the alternative oxide is less than the density of $SiO_2$ or $TiO_2$ or at least maintained in most cases. The details of the theoretical impact of the above alternative formulations on the microstructure constitution are given in Table 1. Besides the additional dilution of cobalt (Co) to an atom fraction of 0.5488, the alternative formulation resulted in a reduction of the weight fraction of the matrix at no significant oxide volume fraction decrease.

TABLE 1

Phase Constitution and Theoretical Fractions of Microstructure Phases

| Alloy Formula | Weight % of Matrix | Volume % of Oxide |
|---|---|---|
| $(Co_{71}Cr_{13}Pt_{16})_{90}$—$(SiO_2)_{10}$ | 92.30 | 28.85 |
| $(Co_{54.88}Cr_{14.62}Si_{12.50}Pt_{18.00})_{80}$—$(CoO)_{20}$ | 80.75 | 27.05 |

Figure 3:
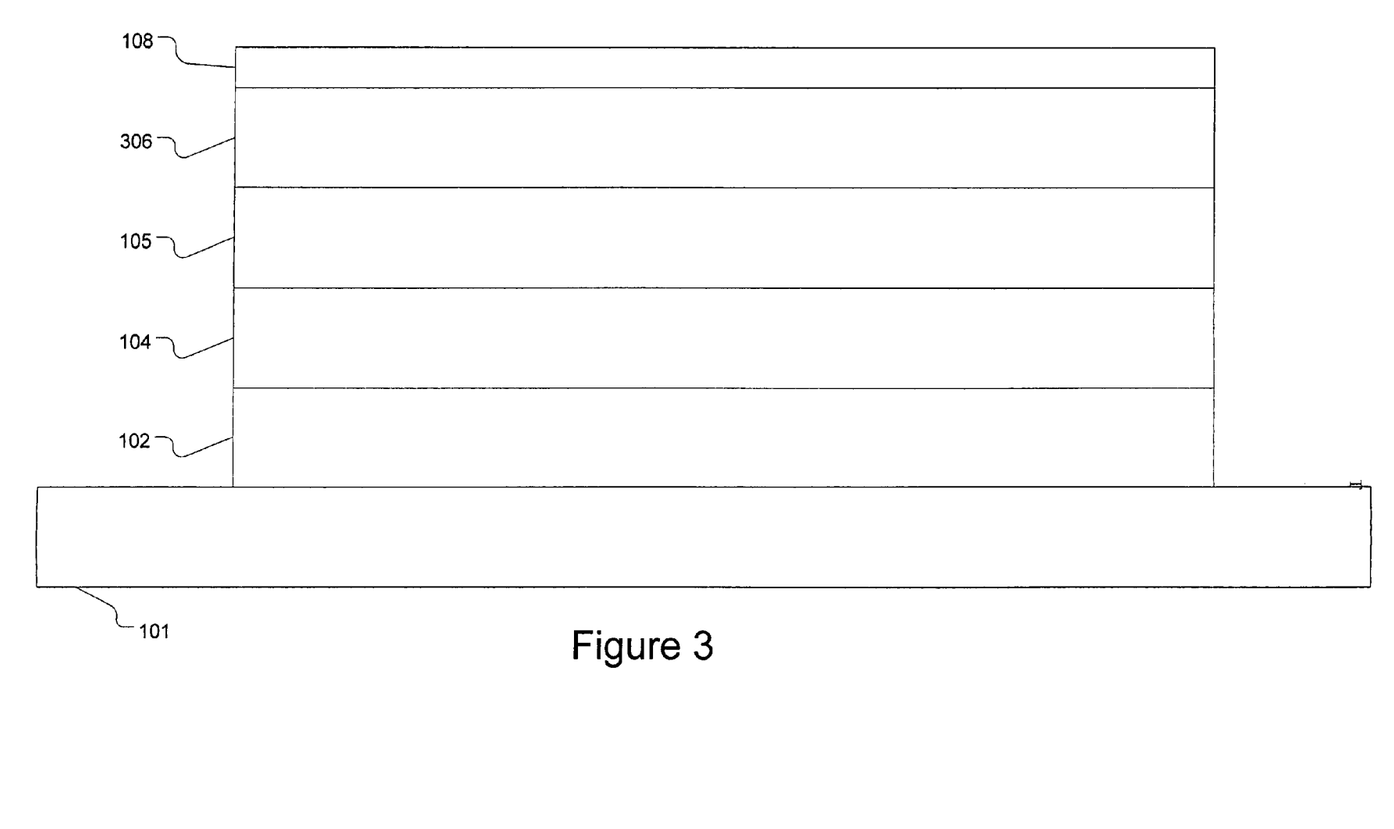
FIG. 3 illustrates a thin film stack for an enhanced magnetic recording media, in which the magnetic data storing layer is comprised of a cobalt-based granular media alloy composition according to a second embodiment of the present invention.

FIG. 3 illustrates a thin film stack for an enhanced magnetic recording media, in which the magnetic data storing layer is comprised of a cobalt-based granular media alloy composition according to a second embodiment of the present invention. As indicated above, layers of thin films are sequentially sputtered onto a substrate by multiple sputter targets, where each sputter target is comprised of a different material or composition.

At the base of the enhanced thin film stack is non-magnetic substrate 101, followed by seed layer 102, which forces the shape and orientation of the grain structure of higher layers. SUL 104 is then deposited to provide a return path for the read/write magnetic field, where SUL 104 is amorphous to prevent magnetic domain formation and SNR degradation.

Seed layer 105 is formed above SUL 104 in order to promote oriented growth of higher layers. Magnetic data-storing layer 306 is deposited over seed layer 105, where data-storing layer 306 is a metal matrix composite composed of a ferromagnetic alloy matrix and a metal oxide. In order to deposit the composition as a data-storing magnetic layer, the cobalt-based granular media alloy composition is manufactured by any of the above-described manufacturing method, fashioned into a sputter target using conventional techniques, and sputtered over a substrate. Finally, carbon lubricant layer 108 is formed over magnetic data-storing layer 306.

According to seventh through twelfth arrangements, the present invention is a cobalt-based granular media alloy composition which is manufactured using any of the above-described manufacturing methods. Further description of the alloy compositions or the manufacturing methods used to produce these compositions is omitted for the sake of brevity.

We turn now to three practical examples of experimental compositions which have been manufactured using the above-described manufacturing methods, under laboratory conditions. $Co_{91}(TiO_2)_9$ granular alloy, such an alloy was formulated into a cobalt-oxide-containing composite $(Co_{89}Ti_{11})_{82}(CoO)_{18}$. The powder blend consisted of a mixture of 99.9% pure cobalt (Co) powder and 99.5% pure CoO and Co-50Ti (at. %) powders. The blend weight percent composition is shown below, in Table 2.

TABLE 2

Blend Compositions For Granular Alloy $Co_{91}(TiO_2)_9$

| Powder Material | Mesh Size | Wt. % |
|---|---|---|
| Co | −100 | 62.0175 |
| CoO | −325 | 22.1705 |
| Co—50Ti | −325 | 15.8120 |

Figure 4:
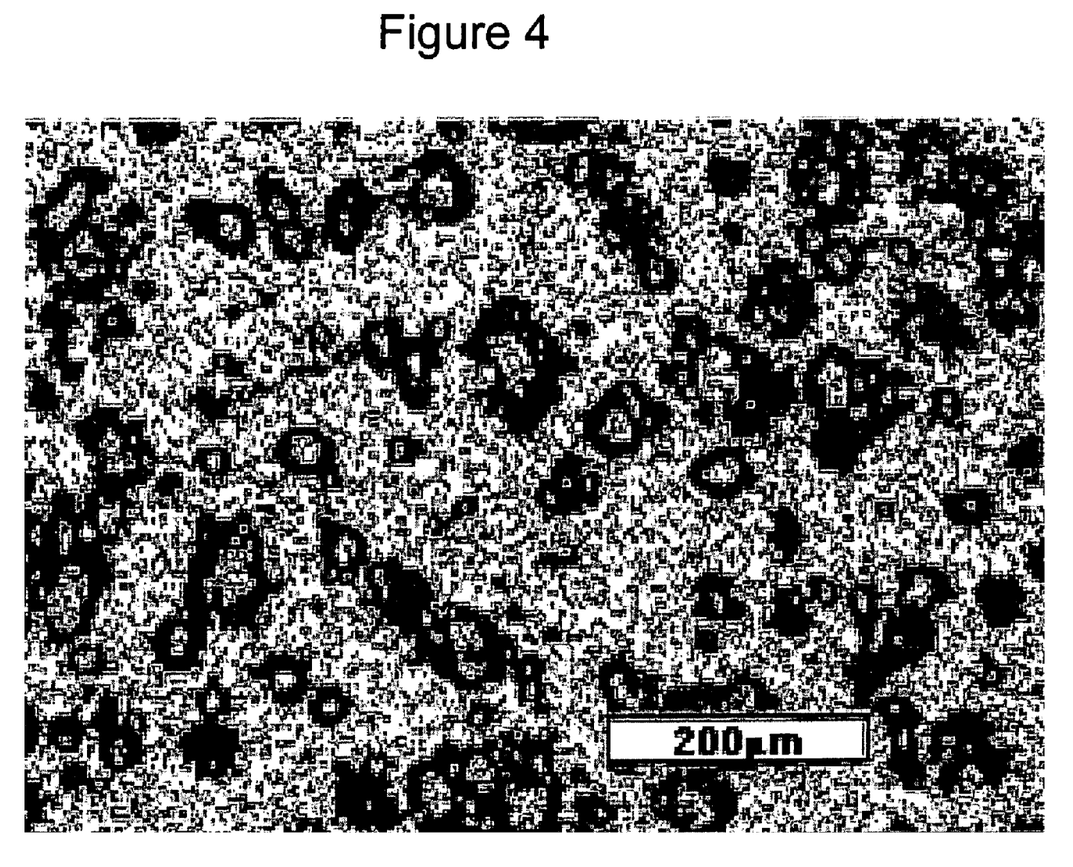
FIG. 4 illustrates a representative microstructure of a consolidated $(Co_{89}Ti_{11})_{82}(CoO)_{18}$ composite material.

The powder was subjected to a 16 hour ball milling cycle to ensure an optical mixing of the blend constituents and complete dispersion of the oxide particles. Prior to consolidation, the powder was encapsulated and evacuated at 450° C. to a partial pressure of $10^{-3}$ torr before loading into a HIP can. The consolidation was accomplished at 1236° C. for 3 hours under 29.5 kilopounds per square inch ("ksi") can pressure. A representative microstructure of the fully consolidated product is illustrated in FIG. 4.

Referring now to a second example relating to the formulation and preparation of a $Co_{91}(Nb_2O_5)_9$ granular alloy, a similar approach was taken to the first example. A $Co_{91}(Nb_2O_5)_9$ granular alloy was prepared by mixing 99.9% pure cobalt (Co) and 99.5% pure CoO and Co-43.2 atomic % powders. The blend composition for the equivalent $(Co_{71.9}Nb_{28.1})_{58.7}(CoO)_{41.3}$ composite is shown below in Table 3.

TABLE 3

Blend Composition For Granular Alloy $Co_{91}(Nb_2O_5)_9$

| Powder Material | Mesh Size | Wt. % |
|---|---|---|
| Co | −100 | 16.97 |
| CoO | −325 | 43.48 |
| Co—43.2Nb | −325 | 39.55 |

Figure 5:
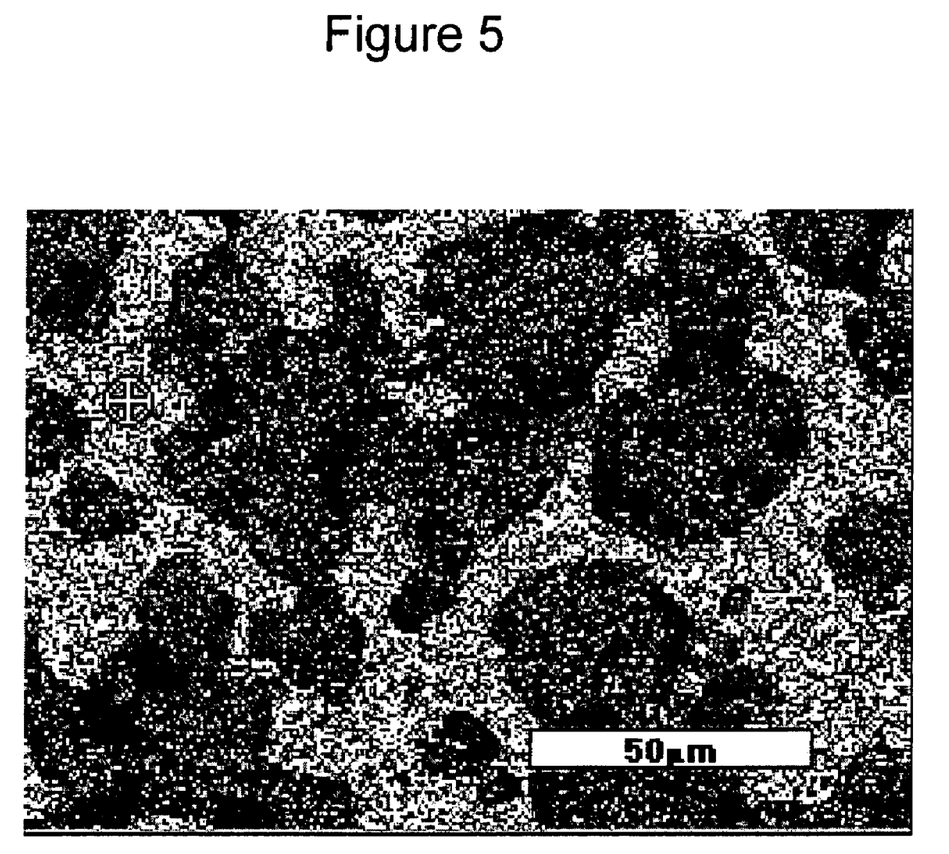
FIG. 5 illustrates a representative microstructure of a consolidated $(Co_{71.9}Nb_{28.1})_{58.7}(CoO)_{41.3}$ composite material.

The powder blend was subjected to a 16 hour ball milling cycle to ensure an optimal mixing of the blend constituents and complete dispersion of the oxide particles. Prior to consolidation, the powder was encapsulated and evacuated at 450° C. to a partial pressure of $10^{-3}$ torr before loading into the HIP can. The consolidation was accomplished at 1236° C. for 3 hours under 29.5 ksi can pressure. A representative microstructure of the fully consolidated product is illustrated in FIG. 5.

Figure 6:
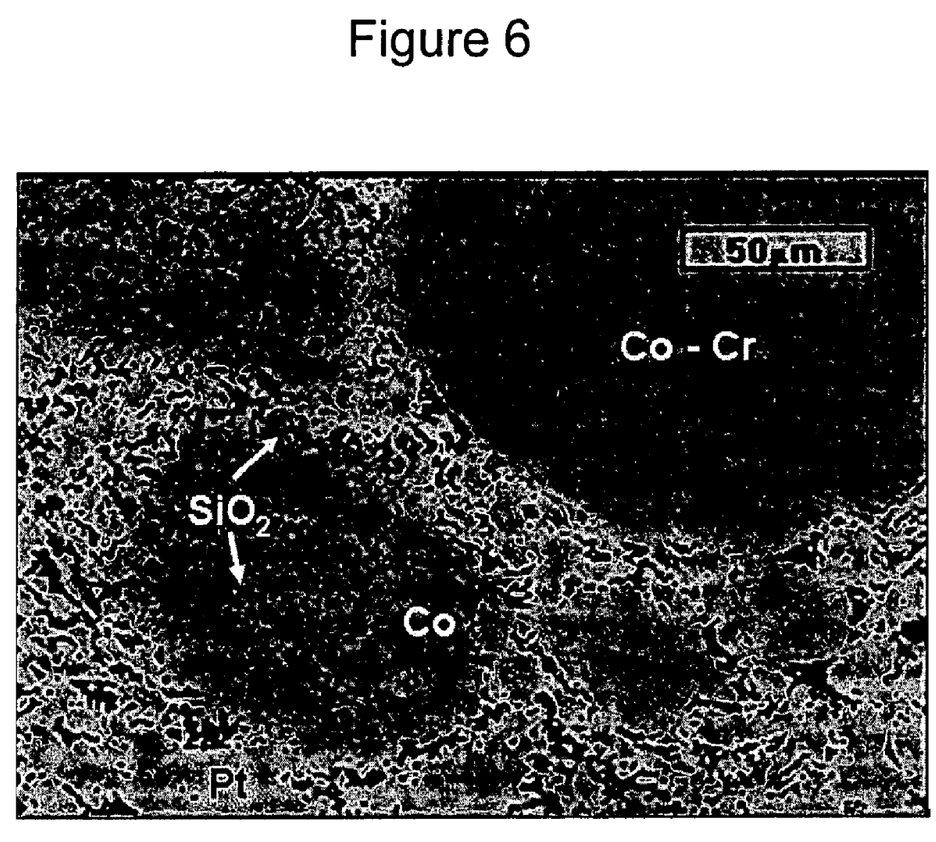
FIG. 6 illustrates a representative microstructure of a consolidated $(Co_{74}Cr_{10}Pt_{16})_{92}\text{—}(SiO_2)_8$ granular alloy, using $SiO_2$.
Figure 7:
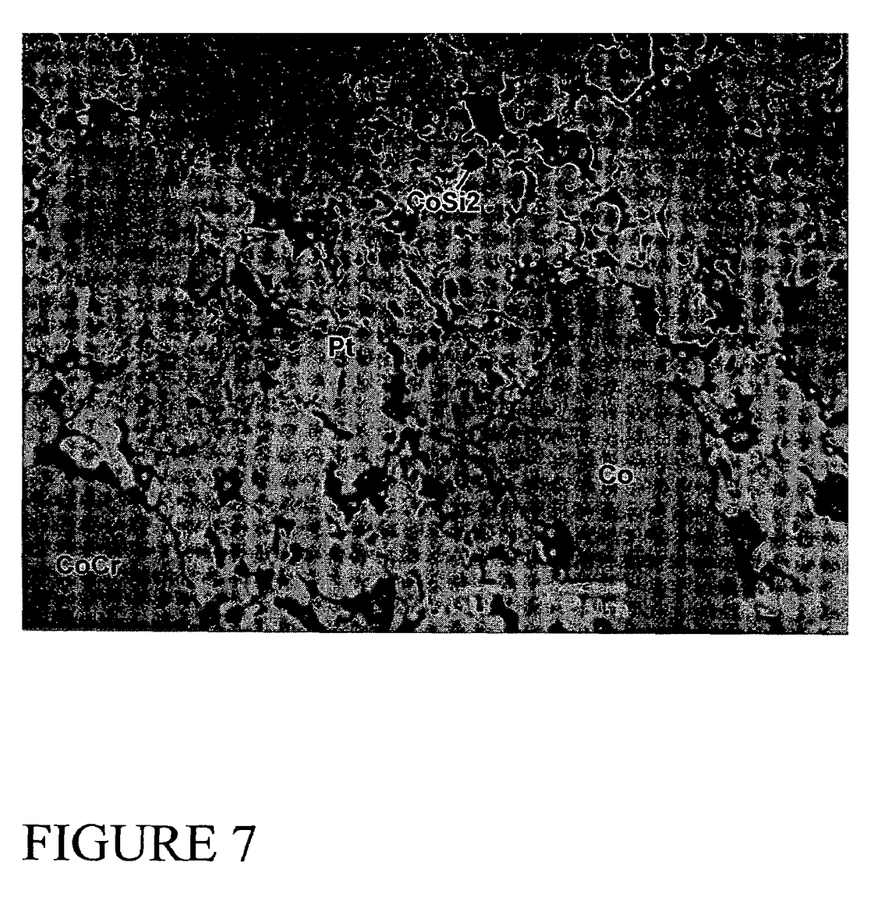
FIG. 7 illustrates a representative microstructure of a consolidated $(Co_{74}Cr_{10}Pt_{16})_{92}\text{—}(SiO_2)_8$ granular alloy, using $(CoSi_2)$ and CoO.

FIG. 6 illustrates a representative microstructure of a consolidated $(Co_{74}Cr_{10}Pt_{16})_{92}$—$(SiO_2)_8$ granular alloy, using $SiO_2$, and FIG. 7 illustrates a representative microstructure of a consolidated $(Co_{74}Cr_{10}Pt_{16})_{92}$—$(SiO_2)_8$ granular alloy, using $(CoSi_2)$ and CoO. In more detail, according to a first approach which is illustrated in FIG. 6 $(Co_{74}Cr_{10}Pt_{16})_{92}$—$(SiO_2)_8$ alloy is manufactured by first calculating an equivalent nominal alloy, $Co_{76.08}Cr_{9.20}Pt_{14.72}$—$(SiO_2)_8$ at. %. The blend uses 100-mesh cobalt (Co) powder at 29.53 wt. %, 100-mesh Co-24.22Cr powder at 27.73 wt. %, <5 μm $SiO_2$ powder at 6.13 wt. %, and platinum (Pt) powder at 36.61 wt. %.

According to a second, enhanced approach depicted in FIG. 7, $(Co_{74}Cr_{10}Pt_{16})_{92}$—$(SiO_2)_8$ alloy is manufactured by blending 16.97 wt. % cobalt (Co) powder, 5.49 wt. % $CoSi_2$ powder, 14.52 wt. % CoO powder, 26.4 wt. % Co-24.22Cr powder, and 36.62 wt. % platinum (Pt) powder. As shown in FIG. 7, using this enhanced approach, a much lower cobalt (Co) content is exhibited.

Referring now to a second example relating to the formulation and preparation of a $Co_{91}(Nb_2O_5)_9$ granular alloy, a similar approach was taken to the first example. A $Co_{91}(Nb_2O_5)_9$ granular alloy was prepared by mixing 99.9% pure cobalt (Co) and 99.5% pure CoO and Co-43.2 atomic % powders. The blend composition for the equivalent $(Co_{71.9}Nb_{28.1})_{58.7}(CoO)_{41.3}$ composite is shown below in Table 3.

The present invention also contemplates a situation in which more than one oxide is required, for alloys in which the oxygen (O) required is higher than the theoretical content carried by a single oxide formula. For instance, if the alloy composition calls for X(Co—Pt—Cr)—Y(Si)-3Y(O), this alloy cannot be manufactured using $SiO_2$ alone, because it would not be possible to meet the necessary Si:O ratio of 1:3, since $SiO_2$ only yields a ratio of 1:2. Therefore, additional cobalt (Co) or chromium (Cr) oxide would be utilized to raise the oxygen (O) content in this situation.

The invention has been described with particular illustrative embodiments. It is to be understood that the invention is not limited to the above-described embodiments and that various changes and modifications may be made by those of ordinary skill in the art without departing from the spirit and scope of the invention.

What is claimed is:

1. A method for manufacturing a quaternary matrix cobalt-based granular media alloy composition formulated as $(Co_aCr_bPt_cM'_dM_e)_{f_1}$-$(M_uO_v)_{f_2}$, M' representing an element selected from the group consisting of boron (B), tantalum (Ta), niobium (Nb), zirconium (Zr), copper (Cu), silver (Ag), gold (Au), and ruthenium (Ru), M representing a base metal different from M' and selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equation $f_1+(u+v)f_2=1$, and d being represented by the equation $d=1-a-b-c$, the method comprising the steps of:

blending a $Co_aCr_bPt_cM'_dM_e$ master alloy powder and a $Co_{u'}O_{v'}$ powder into a corresponding $(Co_aCr_bPt_cM'_dM_e)_{f_1'}$-$(Co_{u'}O_{v'})_{f_2'}$ formula, wherein $f_2'$ is represented by the formula:

$$f_2' = \frac{v}{v'} \cdot f_2,$$

wherein $f_1'$ is represented by the formula $$f_1' = 1 - \frac{v}{v'}(u'+v')f_2, \text{ and}$$

wherein a', b', c' d' and e' are represented by the formulas $$a' = \frac{f_1 \cdot a - u' \cdot \frac{v}{v'} \cdot f_2}{1 - \frac{v}{v'}(u'+v')f_2}$$

$$b' = \frac{f_1 \cdot b}{1 - \frac{v}{v'}(u'+v')f_2}$$

$$c' = \frac{f_1 \cdot c}{1 - \frac{v}{v'}(u'+v')f_2}$$

$$d' = \frac{f_1 \cdot d}{1 - \frac{v}{v'}(u'+v')f_2}$$

$$e' = \frac{f_2 \cdot u}{1 - \frac{v}{v'}(u'+v')f_2}; \text{ and}$$

densifying the blended powders.

2. The quaternary matrix cobalt-based granular media alloy composition of claim 1, wherein M' represents an element selected from the group consisting of silver (Ag), gold (Au), and ruthenium (Ru).

3. The quaternary matrix cobalt-based granular media alloy composition of claim 1, wherein M represents an element selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), niobium (Nb), molybdenum (Mo), ruthenium (Ru), indium (In), lanthanum (La), hafnium (Hf), tantalum (Ta), and tungsten (W).

4. A method for manufacturing a quaternary matrix cobalt-based granular media alloy composition formulated as $(Co_aCr_bPt_cM'_d)_{f_1}$-$(M_uO_v)_{f_2}$, M' representing an element selected from the group consisting of boron (B), tantalum (Ta), niobium (Nb), zirconium (Zr), copper (Cu), silver (Ag), gold (Au), and ruthenium (Ru), M representing a base metal different from M' and selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), zirconium (Zr), niobium (Nb), molybdenum (Mo), ruthenium (Ru), indium (In), lanthanum (La), hafnium (Hf), tantalum (Ta), and tungsten (W), u and v representing the number of atoms of base metal M and oxygen (O) per oxide formula, respectively, a and b representing atom fractions, $f_1$ and $f_2$ representing mole fractions expressed by the equations $f_1+(u+v)f_2=1$, and d being represented by the equation $d=1-a-b-c$, the method comprising the steps of:

blending a $Co_{a'}Cr_{b''}Pt_{c''}M'_{d''}M_{e''}$ master alloy powder and a $Cr_{u''}O_{v''}$ powder into a corresponding $(Co_{a'}Cr_{b''}Pt_{c''M''d''}M_{e''})_{f_1'}$-$(Cr_{u''}O_{v''})_{f_2''}$ formula, wherein $$f_1 \cdot b - \frac{v}{v''} \cdot u'' \cdot f_2 \geq 0,$$

wherein $f_2''$ is represented by the formula:

$$f_2'' = \frac{v}{v''} \cdot f_2,$$

wherein $f_1''$ is represented by the formula $$f_1'' = 1 - \frac{v}{v''}(u'' + v'')f_2, \text{ and}$$

wherein a", b", c", d" and e" are represented by the formulas $$a'' = \frac{f_1 \cdot a}{1 - \frac{v}{v''}(u'' + v'')f_2}$$

$$b'' = \frac{f_1 \cdot b - \frac{v}{v''} \cdot u'' \cdot f_2}{1 - \frac{v}{v''}(u'' + v'')f_2}$$

$$c'' = \frac{f_1 \cdot c}{1 - \frac{v}{v''}(u'' + v'')f_2}$$

$$d'' = \frac{f_1 \cdot d}{1 - \frac{v}{v''}(u'' + v'')f_2}$$

$$e'' = \frac{f_2 \cdot u}{1 - \frac{v}{v''}(u'' + v'')f_2}; \text{ and}$$

densifying the blended powders.

5. The quaternary matrix cobalt-based granular media alloy composition of claim 4, wherein M' represents an element selected from the group consisting of silver (Ag), gold (Au), and ruthenium (Ru).

6. The quaternary matrix cobalt-based granular media alloy composition of claim 4, wherein M represents an element selected from the group consisting of magnesium (Mg), titanium (Ti), vanadium (V), manganese (Mn), iron (Fe), nickel (Ni), copper (Cu), zinc (Zn), aluminum (Al), silicon (Si), yttrium (Y), niobium (Nb), molybdenum (Mo), ruthenium (Ru), indium (In), lanthanum (La), hafnium (Hf), tantalum (Ta), and tungsten (W).

* * * * *